US012701793B2

(12) United States Patent (10) Patent No.: US 12,701,793 B2
Paull (45) Date of Patent: Aug. 4, 2026

(54) SOLAR ARRAY DEVICES WITH STRUCTURAL ELECTRICAL CONNECTIONS

(71) Applicant: Stellaris Corporation, Nashua, NH (US)

(72) Inventor: James B. Paull, Andover, MA (US)

(73) Assignee: STELLARIS CORPORATION, Nashua, NH (US)

( * ) Notice: Subject to any disclaimer, the term of this patent is extended or adjusted under 35 U.S.C. 154(b) by 0 days.

(21) Appl. No.: 18/499,339

(22) Filed: Nov. 1, 2023

(65) Prior Publication Data

US 2024/0145608 A1 May 2, 2024

Related U.S. Application Data

(60) Provisional application No. 63/381,977, filed on Nov. 2, 2022.

(51) Int. Cl.
| | |
|---|---|
| *H10F 19/90* | (2025.01) |
| *F24S 20/63* | (2018.01) |
| *H10F 10/14* | (2025.01) |
| *H10F 19/20* | (2025.01) |
| *H10F 71/00* | (2025.01) |

(52) U.S. Cl.
CPC ............ *H10F 19/904* (2025.01); *F24S 20/63* (2018.05); *H10F 10/148* (2025.01); *H10F 19/20* (2025.01); *H10F 71/121* (2025.01)

(58) Field of Classification Search
CPC ...... H10F 10/148; H10F 19/20; H10F 19/902; H10F 19/904; H10F 71/121; H02S 20/26; H02S 40/36
See application file for complete search history.

(56) References Cited

U.S. PATENT DOCUMENTS

| | | | |
|---|---|---|---|
| 4,137,098 A | 1/1979 | Field | |
| 5,221,363 A | 6/1993 | Gillard | |
| 2006/0283498 A1 | 12/2006 | Gronet | |
| 2007/0079864 A1 | 4/2007 | Gronet | |
| 2008/0257403 A1 | 10/2008 | Edmonds | |
| 2014/0124014 A1* | 5/2014 | Morad | H10F 19/00 |
| | | | 136/246 |
| 2016/0225931 A1 | 8/2016 | Heng et al. | |
| 2019/0036480 A1 | 1/2019 | Barr et al. | |
| 2021/0273125 A1 | 9/2021 | Paull | |

OTHER PUBLICATIONS

Invitation to Pay Additional Fees from corresponding PCT Appln. No. PCT/US2023/078304, dated Feb. 6, 2024.
International Search Report and Written Opinion from corresponding PCT Appln. No. PCT/US2023/078304, dated May 1, 2024.

* cited by examiner

*Primary Examiner* — Golam Mowla
(74) *Attorney, Agent, or Firm* — Secant IP, PLLC

(57) ABSTRACT

A solar cell array assembly that includes a first solar cell having a first side and a second side; a second solar cell in a stacked below the first cell, the second cell having a first side and a second side; and a structural conductor disposed between the first cell and second cell; wherein the structural conductor being selected to support a weight of, at least, the first cell to maintain a selected distance between the first cell and the second cell; and wherein the structural conductor being electrically coupled to the second side of the first cell and the first side of the second cell.

22 Claims, 6 Drawing Sheets

SOLAR ARRAY DEVICES WITH STRUCTURAL ELECTRICAL CONNECTIONS

CROSS-REFERENCE TO RELATED APPLICATIONS

The present application claims the benefit of U.S. Provisional Application Ser. No. 63/381,977, filed Nov. 2, 2022, which is hereby incorporated by reference in its entirety.

FIELD

The present disclosure is generally directed to solar array devices with structural electrical connections.

BACKGROUND

Prior art has disclosed the application of photovoltaic cells onto multiple horizontal slats that may be installed outside a window, inside a window, or inside a multiple pane window (Gilliard U.S. Pat. No. 5,221,363, Field U.S. Pat. No. 4,137,098). Other art has described photovoltaic cells embedded horizontally or at an angle in a transparent material that then comprises a window pane (Paull US 2021/0273125 A1, Edmonds US 2008/0257403 A1).

The benefit purported for this art is that windows may be able to generate valuable photovoltaic electricity while still maintaining high window transparency. Additional benefits may be the ability to use proven and high-efficiency silicon photovoltaic cells and to avoid optical and other losses that may be inherent in other photovoltaic window technologies such as luminescent concentrators.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figures 1A, 1B, 1C, 1D:
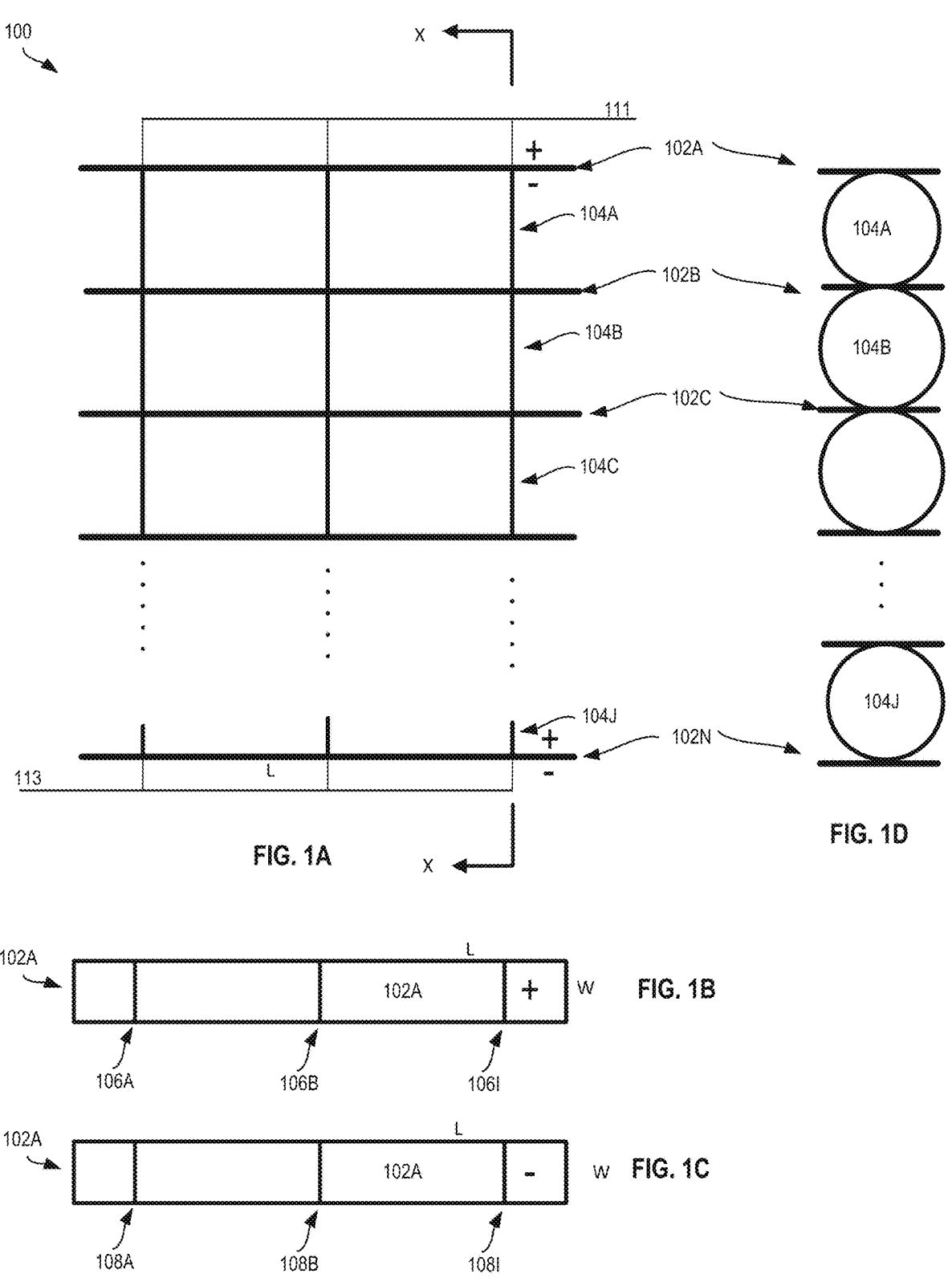
FIG. 1A illustrates a front (or back) view of a solar array according to embodiments of the present disclosure.
FIG. 1B illustrates a top view of an example representative solar cell.
FIG. 1C illustrates a bottom view of the example representative solar cell.
FIG. 1D illustrates a cross-sectional view of the array 100, taken along lines X-X of FIG. 1A.

Although the following Detailed Description will proceed with reference being made to illustrative embodiments, many alternatives, modifications and variations thereof will be apparent to those skilled in the art.

DETAILED DESCRIPTION

The present disclosure describes solar array devices and methods of constructing solar array devices. In embodiments described herein, a solar array device includes a plurality of solar cells in a stacked array with individual solar cells being connected to adjacent solar cells using structural electrical conductors. The cells may include relatively narrow solar cells in array, whereby the solar cells are oriented horizontally or at a shallow angle from the horizontal, which may be, for example, from 1 to 35 degrees from the horizontal, and are positioned in rows to make a vertical stack. Individual solar cells are connected by structural electrical connectors preferably via solder, conductive adhesive, or other means as is known in the art. The structural electrical connectors attached to the buss pads of the solar cells make the array a self-supporting relatively rigid structure or cell lattice that can, e.g., stand on its own without any substrates or additional support.

Advantageously, by eliminating a need for a substrate to support the cells, the teachings of the present disclosure provide a solar module that may include bi-facial photovoltaic cells, and thus the cells may generate electricity from both their lower and upper surfaces. The solar cells may be formed of, for example, crystalline silicon and/or or other relatively rigid solar cells known in the art. The solar cells may be having a width in the range of 3.0 mm to 15.0 mm, although other widths may be used. Center-to-center spacing between rows may vary considerably, with larger spacing affording somewhat better transparency but less electrical power output and smaller spacing somewhat reducing transparency but generating more power. An example range of center-to-center row spacings may be from 0.3 to 2.0 times the solar cell width, although other ratios may still work. This solar cell lattice may be especially useful as an electricity-generating photovoltaic array on the inside of an insulated glass window unit.

In one example embodiment, one or more solar arrays may be incorporated into an insulated glass window unit, for example, the one or more solar arrays may be incorporated between lites (panes) of an insulated glass window that may comprise two or more lites, i.e., incorporated in the cavity between two glass panes in an insulated glass window. In this embodiment, optical coatings typically applied to insulated glass windows such as low-e coatings may be applied to surface of the window assembly so as not to diminish the light reaching the solar cell lattice. The cavity between the glass surfaces containing the one or more solar lattice modules may be filled with air or an inert gas such as argon, as is known in the industry, or filled with a clear fluid such as silicone oil or mineral oil. A fluid-filled insulated glass window may reduce light reflection losses that might otherwise occur at the interface of the glass and air on the inside of the window due to differences in refractive indices. A fluid-filled window may also help dissipate heat generated by the solar cells.

FIG. 1A illustrates a front (or back) view of a solar array 100 according to embodiments of the present disclosure. The array 100 includes a plurality of solar photovoltaic cells (solar cells) 102A, 102B, . . . , 102N in a stacked arrangement. In some embodiments the width of the cell is substantially less than a length of the cell. The plurality of solar cells 102A, 102B, . . . , 102N may be stacked generally horizontally (as illustrated) and generally parallel to one another. In other embodiments, the plurality of solar cells 102A, 102B, . . . , 102N may be stacked at an angle with respect to a horizon, and may further be spaced from one another in a non-parallel fashion. The solar cells 102A, 102B, . . . , 102N may be single-sided (power generation from one side) and/or bi-facial to generate power from light incident on both the upper and lower surface of the cell. The solar cells 102A, 102B, . . . , 102N may each be formed using conventional and/or proprietary solar cell structures, for example, a crystalline silicon cell structure (e.g., poly-silicon and monocrystalline silicon cells), and/or other rigid or semi-rigid solar cell structures, etc. The length (L) of each solar cell 102A, 102B, . . . , 102N in the array 100 may be selected based on, for example, operating environment constraints, structural integrity of individual cells, weight constraints, desired overall voltage/current/power developed by the array 100, etc. In some embodiments, the length L of each cell 102A, 102B, . . . , 102N may be approximately the same, or different. For example, differing cell lengths may provide aesthetic enhancements when the array 100 is disposed between panes of a window. In some embodiments, the length (L) of the cells may be standardized, common lengths, for example, 156 mm, etc.

FIG. 1A illustrates bi-facial cells 102A, 102B, . . . , 102N in a stacked arrangement to form the array 100. As is known for bi-facial cells, each cell has a polarity as designated "+" on a top side of each cell 102A, 102B, . . . , 102N and "−" on a bottom side of each cell 102A, 102B, . . . , 102N. The cells 102A, 102B, . . . , 102N illustrated in FIG. 1A are coupled in series with each adjacent cell, and overall power of the array 100 may be taken at lead lines 111 (+) and 113 (−), representing the DC voltage that is developed by the array 100.

FIG. 1B illustrates a top view of an example representative solar cell, for example, representative solar cell 102A. The top side of cell 102A is designated as the positive (+) polarity side of the cell. Cell 102A may include one or more conducting bus pads 106A, 106B, . . . , 1061, where each bus pad 106A, 106B, . . . , 1061 reflects the total positive potential developed by the cell 102A. Providing multiple bus pads 106A, 106B, . . . , 1061 along the length (L) of the cell 102A may operate to reduce ohmic losses. The cell 102A has an overall width (W) that may be selected based on, for example, operating environment constraints, desired overall voltage/current/power developed by the array 100, etc. Other cells 102B, . . . 102N in the array (FIG. 1A) may each be similar to the representative cell 102A illustrated in FIG. 1B.

FIG. 1C illustrates a bottom view of the example representative solar cell 102A. The bottom side of cell 102A is designated as the negative (−) polarity side of the cell. The negative side of cell 102A includes one or more conducting bus pads 108A, 108B, . . . , 1081, where each bus pad 108A, 108B, . . . , 1081 represents the total negative potential developed by the cell 102A. Bus pads 108A, 108B, . . . , 1081 are aligned vertically with bus pads 106A, 106B, . . . , 1061, as is typically done in the art. Other cells 102B, . . . 102N in the array (FIG. 1A) may be similar to the representative cell 102A illustrated in FIG. 1C. As is understood in the art, one side of cell may be more efficient than the other side of the cell (which can be either polarity), and in some embodiments, the most efficient side of each cell may be selected to face upward.

Referring again to FIG. 1A, to provide structural integrity to the array 100 and electrical connection between cells, an array of structural conductors 104A, 104B, . . . , 104J are disposed between each cell 102A, 102B, . . . , 102N. Each conductor 104A, 104B, . . . , 104J is electrically coupled (e.g., soldered, etc.) to corresponding top bus pads 106A, 106B, . . . , 1061 and bottom bus pads 108A, 108B, . . . , 1081 on an adjacent cell. In one example embodiment, each conductor 104A, 104B, . . . , 104J may be formed as a "hoop" of relatively thin wire, such as pre-tinned un-insulated copper wire. As a general matter, the structural conductors are formed to provide support for each of the cells above a given cell, i.e., so that movement or displacement of the cells relative to one another is reduced or eliminated. By way of example, the gauge of the wire forming each conductor 104A, 104B, . . . , 104J may be of the order of (0.005 inches, 127 microns) to (0.032 inches, 813 microns), although a wider range of wire diameters may be used depending on the number of conductors and the gap between the cells 102A, 102B, . . . , 102N. The conductors 104A, 104B, . . . , 104J may be relatively flexible and have a diameter slightly greater than the space between adjacent cells, for example, in a range of 2% to 15% greater, to facilitate positioning the hoops and providing sure electrical contact to the bus pads prior to soldering. The conductors 104A, 104B, . . . , 104J may be formed of multiple windings, which may enhance capillary action during soldering, drawing solder around the hoop and adding additional structural support to the cell lattice.

Figure 1E:
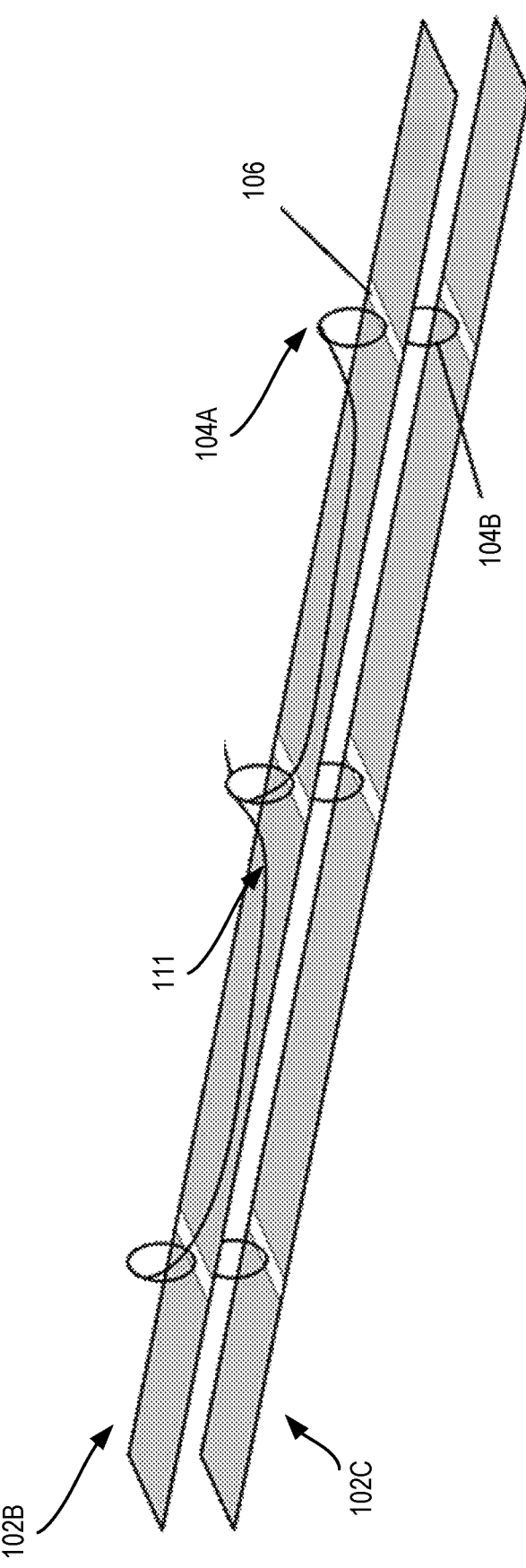
FIG. 1E illustrates a perspective view of two cells of the array of FIG. 1A.

FIG. 1D illustrates a cross-sectional view of the array 100, taken along lines X-X of FIG. 1A. In the example of FIG. 1D, the conductors 104A, 104B, . . . , 104J are formed as generally circular "hoops" and soldered to each adjacent cell. In some embodiments, the "hoops" may be oblong, triangular, rectangular, polygon, etc. and/or other geometric forms such as "C-shaped", "U-shaped", "S-Shaped", "Z-Shaped", etc., and/or straight linear conductors, etc. In some embodiments, the structural electrical conductors 104A, 104B, . . . , 104J may be a solid material such as relatively thin copper sheets that may preferably be between 1 mm and 3 mm thick that, when soldered or otherwise joined to adjacent cell bus pads, provide sufficient structural support for the array 100. FIG. 1E illustrates a perspective view of two cells of the array 100, for example, cells 102B and 102C. FIG. 1E illustrates the connection between the conductors 104A, 104B, . . . , 104J and the bus pads 106 and 108 of cells 102B and 102C.

Figure 2:
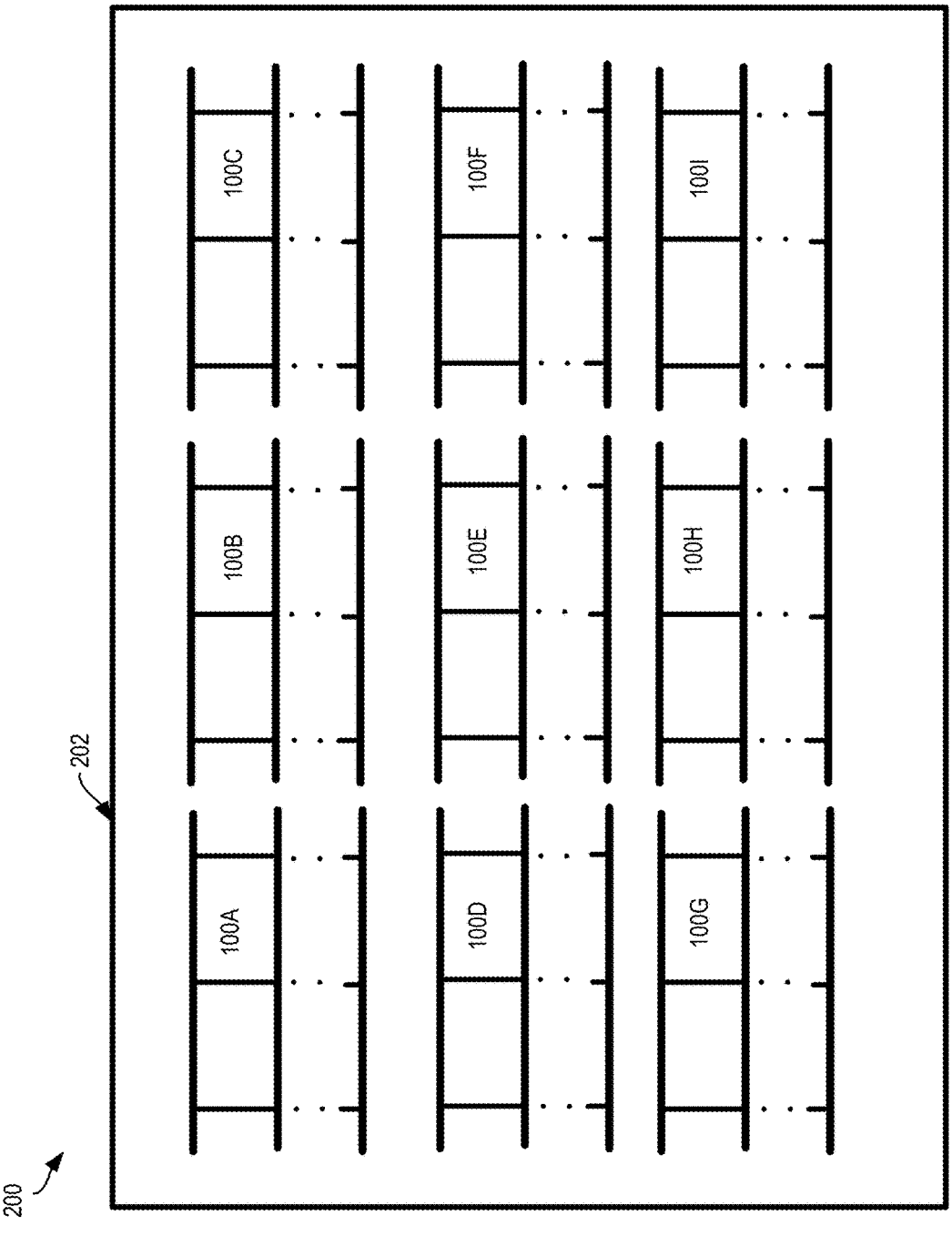
FIG. 2 illustrates a tiled arrangement of solar arrays installed within a window according to embodiments of the present disclosure.

FIG. 2 illustrates a tiled arrangement 200 of solar arrays installed within a window according to embodiments of the present disclosure. In this example embodiment a 3×3 tiled arrangement of arrays 100A, 100B, . . . , 100I is illustrated as being installed into a window, i.e., between panes of a double pane window. The window generally includes a frame 202 made from metal spacers that separate and support the glass panes. As is known in the art of windows, sealants such as hot-melt butyl, silicone or other adhesives are applied to the outside of the spacer frame to hold the glass pane and the spacers together. The frame 202, and may be formed of wood, metal, composite materials, etc., typically using aluminum spacers and plastic corner inserts, etc. Electrical connections between arrays 100A, 100B, . . . , 100I may be formed in a variety of ways as would be understood by those skilled in the art. For example, arrays in each horizontal row (e.g., arrays 100A, 100B and 100C) may be electrically coupled together in series so that voltage of that row is represented by the sum of the arrays in that row. Each row may then be electrically coupled together in series or in parallel. In other embodiments, arrays in each vertical column (e.g., arrays 100A, 100D and 100G) may be electrically coupled together in series so that voltage of that column is represented by the sum of the arrays in that column. Each column may then be electrically coupled together in series or in parallel. In still other embodiments, each array may be coupled together in series or in parallel. Selection of series and/or parallel coupling of arrays may be based on, for example, a target overall maximum voltage that can be delivered by the window unit. Power produced by the arrays 100A, 100B, . . . , 100I may be coupled to inverter systems (not shown) and may form part of an alternative power source for a building, etc. In some embodiments, insulating connectors (not shown) may be used within the window structure.

Figures 3A, 3B, 3C:
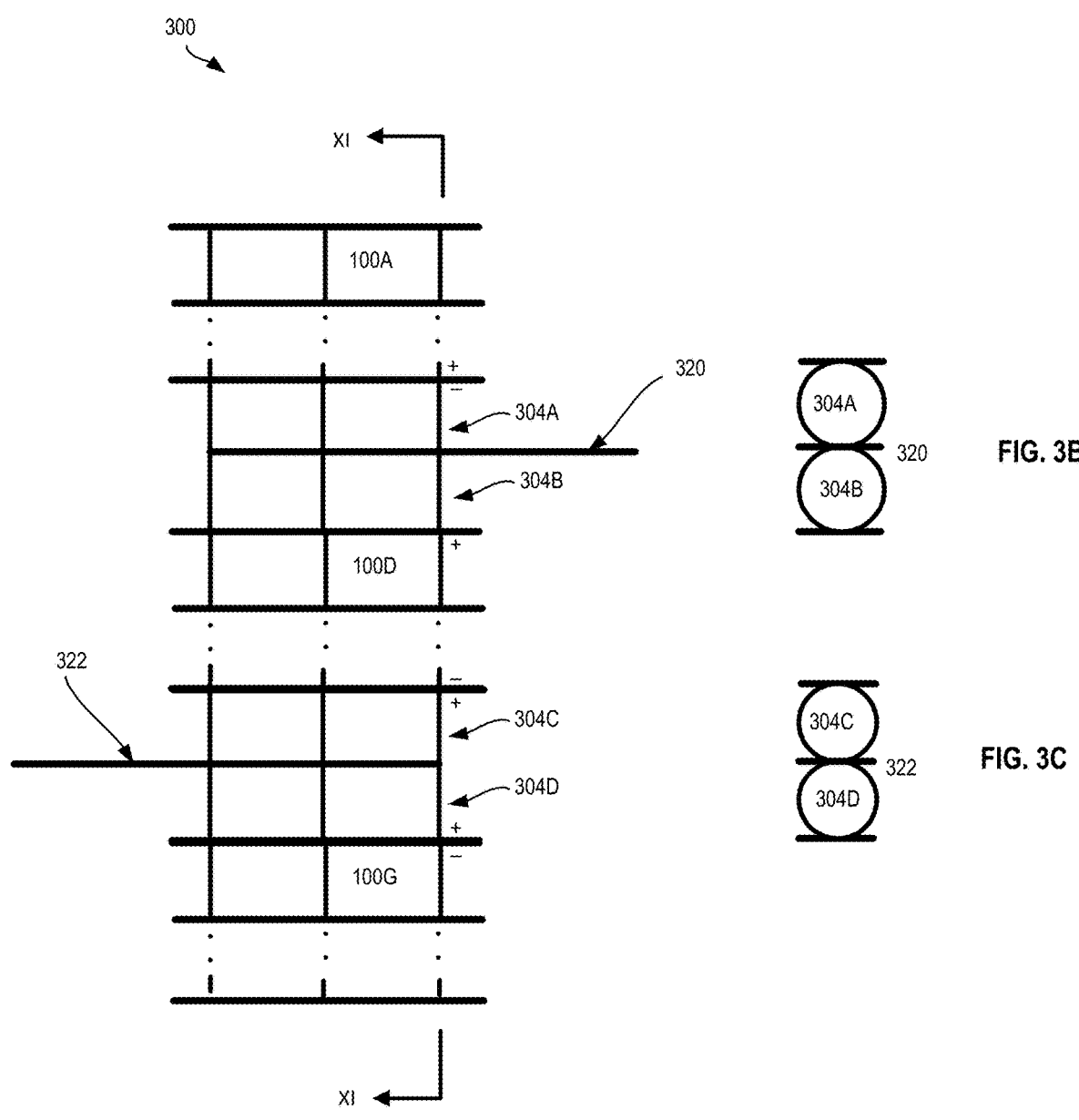
FIG. 3A illustrates a column of arrays of FIG. 2.
FIGS. 3B and 3C illustrate cross-sectional views taken along lines XI-XI of FIG. 3A.

In some embodiments, and to reduce complexity in connecting arrays, the arrays may be oriented so that common polarities line up between the first row (arrays 100A, 100B, 100C) and the second row (arrays 100D, 100E, 100F), and between the second row and the third row (arrays 100G, 100H, 100I). FIG. 3A illustrates this concept, and shows a column of arrays 100A, 100D, and 100G from FIG. 2. As illustrated, the polarity (−) of the bottom surface of the bottom cell of array 100A matches the polarity (−) of the top surface of the top cell of array 100D. Similarly, the polarity (+) of the bottom surface of the bottom cell of array 100D matches the polarity (+) of the top surface of the top cell of array 100G. A single lead line 320 may then be used for the common polarity of arrays 100A and 110D, and a single lead line 322 may be used for the common polarity of arrays 100D and 100G. Of course, these concepts can be extended to multiple columns and/or rows of arrays, as illustrated in FIG. 2. The electrical connection between the bottom cell of array 100A and the lead line 320 may be formed using a structural electrical conductor 304A, as described herein. Similarly, the electrical connection between the lead line 320 and the top cell of array 100D, the electrical connection between the bottom cell of array 100D and the lead line 322, and the electrical connection between the lead line 322 and the top cell of array 100G may be formed using the structural electrical conductor, as described herein. FIGS. 3B and 3C illustrate cross-sectional views taken along lines XI-XI of FIG. 3A, illustrating the lead line 320 and structural electrical conductors 304A and 304B (FIG. 3B), and the lead line 322 and structural electrical conductors 304C and 304B (FIG. 3C). Electrical conductors 304A, 304B, 304C and 304D may be formed in a similar manner as other structural electrical conductors of the arrays, to provide visual consistency for the entire panel of tiled arrays. In some embodiments, lead line 320 and/or 322 may be formed having similar dimensions, appearance and spacing as adjacent solar cells, so that again visual consistency is maintained.

Figures 4A, 4B:
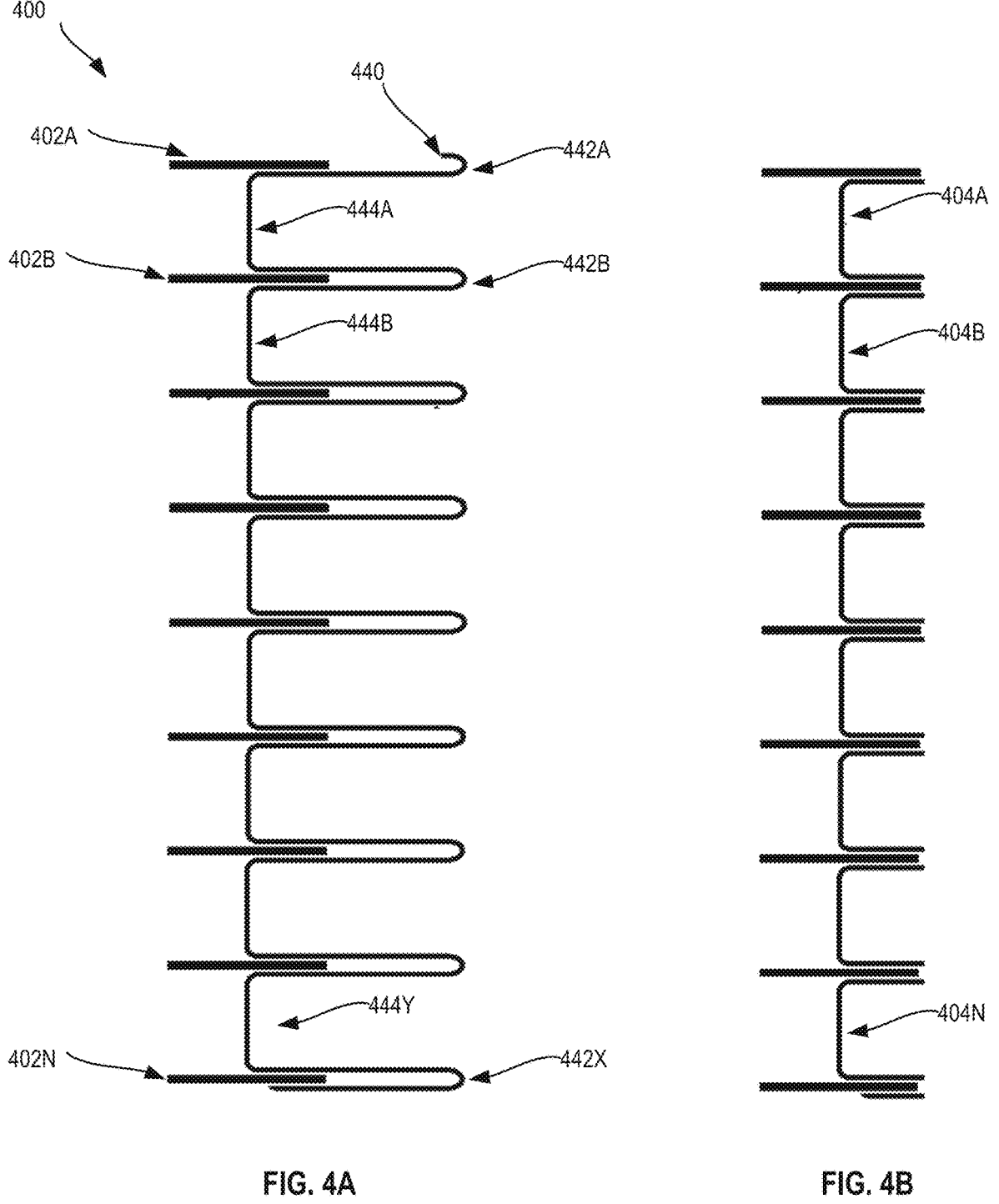
FIGS. 4A-4B illustrate manufacturing techniques according to one embodiment of the present disclosure.

FIGS. 4A-4B illustrate manufacturing techniques according to one embodiment of the present disclosure. In particular, FIGS. 4A-4B illustrate manufacturing techniques to form a solar cell array having structural electrical conductors between each cell of the array 400, as shown in the array 100 of FIG. 1A. FIG. 4A illustrates a cross-sectional view of the array 400 (similar to the views shown in FIGS. 1D, 3C and 3D). In this embodiment, a continuous section of conducting material 440 is aligned with the bus pads of each cell 402A, 402B, . . . , 404N of the array 400. The continuous conducting material 440 is formed as an alternating serpentine pattern of thin loops 442A, 442B, . . . , 442X and thick loops 444A, 444B, . . . , 444Y. The thin loops 442A, 442B, . . . , 442X each have a loop dimension approximately equal to a thickness of the cells 402A, 402B, . . . , 404N. The thick loops 444A, 444B, . . . , 444Y each have a loop dimension approximately equal to a desired or target spacing between each cell 402A, 402B, . . . , 404N. The thick loops 444A, 444B, . . . , 444Y may be soldered to the bus pads of each cell. In FIG. 4B, the continuous conducting material 440 may be trimmed so that portions of the continuous conducting material 440 that extend beyond the width of the cells 402A, 402B, . . . , 404N is removed. This trimming process can be accomplished in a single step using, for example, machine cutting, laser cutting, etc. The thick loops remain, thus forming the structural conductors 404A, 404B, . . . , 404N between each cell. In the example shown in FIGS. 4A and 4B, the structural conductors 404A, 404B, . . . , 404N are formed having a "C-Shape". Of course, in other embodiments, the shape of the structural conductors may include "hoops" and/or other shapes, as described above.

Figure 5:
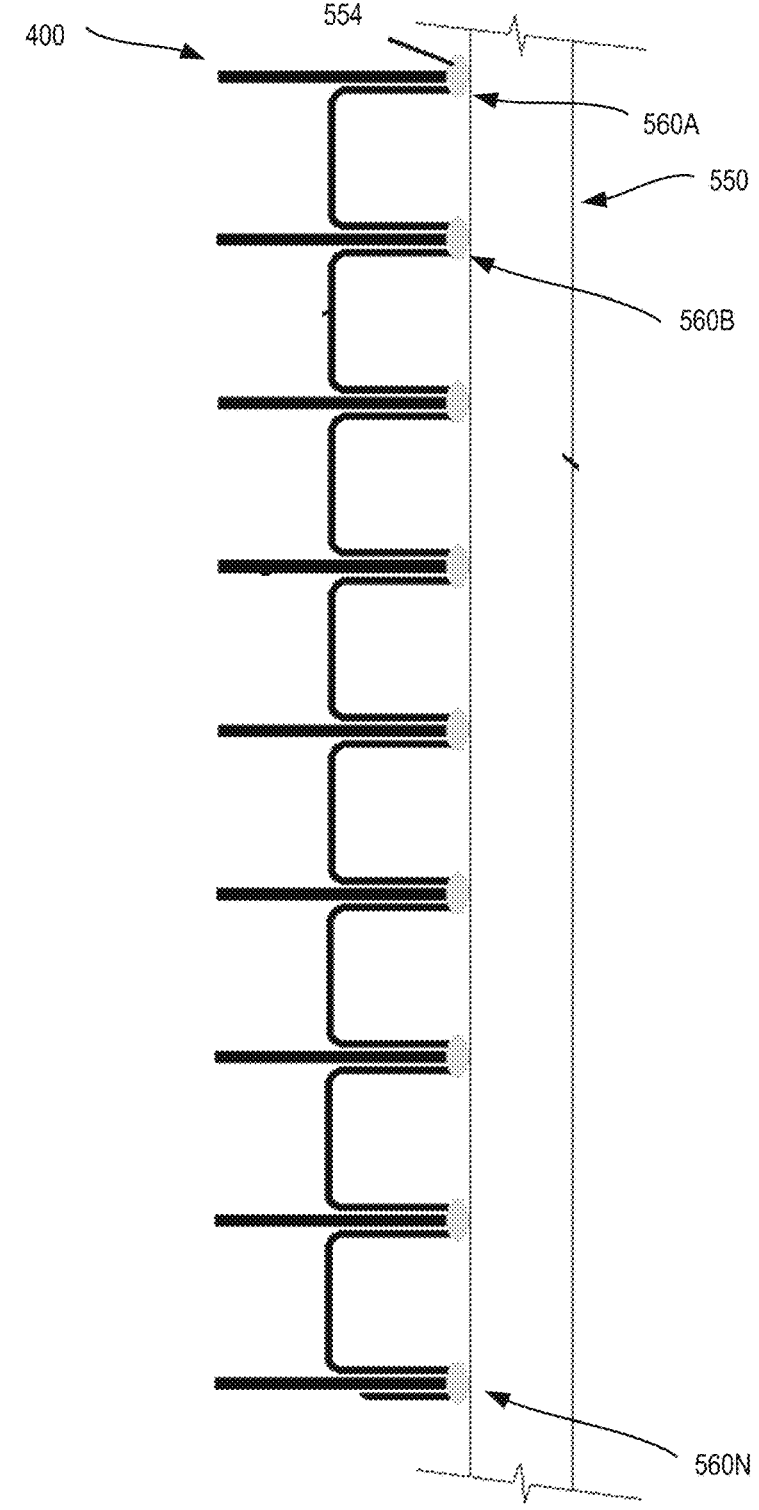
FIG. 5 illustrates a side view of a solar array according to another embodiment of the present disclosure.

FIG. 5 illustrates a side view of a solar array 500 another according to another embodiment of the present disclosure. In particular, FIG. 5 illustrates a window pane having a solar cell array. In this example embodiment, the array 400, produced using the techniques described above with reference to FIGS. 4A and 4B, is affixed to one side of a window pane 550. For example, adhesive 554 may be placed at one or more junction points 560A, 560B, . . . , 530N of the cells and structural conductors of the array. The adhesive 554 is generally selected to adhere to the surface of the window pane 550, to reduce or eliminate movement of the array 400 with respect to the window pane 550, and may include glue, silicone, etc. Although a single window pane 550 is illustrated in FIG. 5, in other embodiments, the array 400 may be disposed between window panes.

Accordingly, one embodiment of the present disclosure provides a solar cell array assembly. The array includes a first solar cell having a first side and a second side; a second solar cell in a stacked below the first cell, the second cell having a first side and a second side; and a structural conductor disposed between the first cell and second cell. The structural conductor being selected to support a weight of, at least, the first cell to maintain a selected distance between the first cell and the second cell; and wherein the structural conductor being electrically coupled to the second side of the first cell and the first side of the second cell.

Another embodiment of the present disclosure provides a panel of solar cell arrays. The panel includes a plurality of solar cell arrays electrically coupled together. Each solar cell array includes a first solar cell having a first side and a second side; a second solar cell in a stacked below the first cell, the second cell having a first side and a second side; and a structural conductor disposed between the first cell and second cell. The structural conductor being selected to support a weight of, at least, the first cell to maintain a selected distance between the first cell and the second cell; and wherein the structural conductor being electrically coupled to the second side of the first cell and the first side of the second cell.

Another embodiment of the present disclosure provides a solar window assembly with solar power generation. The window assembly includes a first window pane; a second window pane adjacent the first window pane; a frame to house the first and second window panes; and a solar cell array. The solar cell array includes a first solar cell having a first side and a second side; a second solar cell in a stacked below the first cell, the second cell having a first side and a second side; and a structural conductor disposed between the first cell and second cell. The structural conductor being selected to support a weight of, at least, the first cell to maintain a selected distance between the first cell and the second cell; and wherein the structural conductor being electrically coupled to the second side of the first cell and the first side of the second cell.

In yet another embodiment, the present disclosure provides a method of manufacturing a solar cell array. The method includes aligning a continuous section of conducting material to bus pads of a first solar cell and a second solar cell. The continuous section of conduction material being formed as an alternating serpentine pattern of thin loop sections and thick loop sections. Each thin loop section having a loop diameter approximately equal to a thickness of the first and second solar cells, and each thick loop section having a loop diameter approximately equal to a target spacing between the first cell and the second cell.

The method also includes soldering the thick loop section to the bus pads of the first solar cell and the second solar cell.

The method further includes removing the thin loop sections of the conductive material at a point flush with a width of the first and second solar cells.

As used herein, the terms "side", "front", "back", "tope", bottom", etc. are provided as a descriptive aid, not as a limitation or specific orientation. While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A solar cell array assembly, comprising:
a first solar cell having a first side and a second side,
a second solar cell in a stacked arrangement with the first cell, the second cell having a first side and a second side; and
a structural conductor disposed between the first cell and second cell; wherein the structural conductor being selected to support a weight of, at least, the first cell to maintain a selected distance between the first cell and the second cell; and wherein the structural conductor being electrically coupled to the second side of the first cell and the first side of the second cell, wherein the first and second solar cells and the structural conductor forming a self-supporting array; and wherein
the first and second solar cells being arranged horizontally in rows, wherein the second cell being stacked on top of and spaced apart from the first cell to make a vertical stack.

2. The solar cell array of claim 1, wherein the first and second cells are bi-facial solar configured to produce electrical power on both the first and second sides of the first and second cells.

3. The solar cell array of claim 1, wherein the structural conductor is formed of wire having a diameter of about 0.005 inches to 0.032 inches.

4. The solar cell array of claim 1, wherein the first and second cells are bi-facial solar configured to produce electrical power on both the first and second sides of the first and second cells; and wherein the first and second cells having a bus pad disposed on the first and second sides; wherein the structural conductor is soldered to the bus pad on the second side of the first cell and the first side of the second cell.

5. The solar cell array of claim 1, wherein the structural conductor is formed having a continuous circular, oblong, rectangular, triangular or polygon shape.

6. The solar cell array of claim 1, wherein the structural conductor is formed having a "C" shape or a "U" shape.

7. A panel of solar cell arrays, comprising:
a plurality of solar cell arrays electrically coupled together; each solar cell array comprising:
a first solar cell having a first side and a second side,
a second solar cell in a stacked arrangement with the first cell, the second cell having a first side and a second side; and
a structural conductor disposed between the first cell and second cell; wherein the structural conductor being selected to support a weight of, at least, the first cell to maintain a selected distance between the first cell and the second cell; and wherein the structural conductor being electrically coupled to the second side of the first cell and the first side of the second cell;
wherein the first and second solar cells and the structural conductor of each solar cell array forming a self-supporting array; and wherein
the first and second solar cells being arranged horizontally in rows, wherein the second cell being stacked on top of and spaced apart from the first cell to make a vertical stack.

8. The panel of solar cell arrays of claim 7, wherein the first and second cells of each array are bi-facial solar configured to produce electrical power on both the first and second sides of the first and second cells.

9. The panel of solar cell arrays of claim 7, wherein the structural conductor is formed of wire having a diameter of about 0.005 inches to 0.032 inches.

10. The panel of solar cell arrays of claim 7, wherein the first and second cells of each array are bi-facial solar configured to produce electrical power on both the first and second sides of the first and second cells; and wherein the first and second cells having a bus pad disposed on the first and second sides; wherein the structural conductor is soldered to the bus pad on the second side of the first cell and the first side of the second cell.

11. The panel of solar cell arrays of claim 7, wherein the structural conductor is formed having a continuous circular, oblong, rectangular, triangular or polygon shape.

12. The panel of solar cell arrays of claim 7, wherein the structural conductor is formed having a "C" shape or a "U" shape.

13. The panel of solar cell arrays of claim 7, wherein the arrays are electrically coupled together in series.

14. The panel of solar cell arrays of claim 7, wherein the arrays are electrically coupled together in parallel.

15. The panel of solar cell arrays of claim 7, wherein the arrays are electrically coupled together in both series and parallel to generate a target maximum voltage of the panel of arrays.

16. A solar window assembly with solar power generation, comprising:
a first window pane;
a second window pane adjacent the first window pane;
a frame to house the first and second window panes; and
a solar cell array comprising:
a first solar cell having a first side and a second side,
a second solar cell in a stacked arrangement with the first cell, the second cell having a first side and a second side; and
a structural conductor disposed between the first cell and second cell; wherein the structural conductor being selected to support a weight of, at least, the first cell to maintain a selected distance between the first cell and the second cell; and wherein the structural conductor being electrically coupled to the second side of the first cell and the first side of the second cell; wherein the first and second solar cells and the structural conductor forming a self-supporting array; and wherein
the first and second solar cells being arranged horizontally in rows, wherein the second cell being stacked on top of and spaced apart from the first cell to make a vertical stack.

17. The solar window assembly of claim 16, wherein the first and second cells are bi-facial solar configured to produce electrical power on both the first and second sides of the first and second cells.

18. The solar window assembly of claim 16, wherein the structural conductor is formed of wire having a diameter of about 0.005 inches to 0.032 inches.

19. The solar window assembly of claim 16, wherein the first and second cells are bi-facial solar configured to produce electrical power on both the first and second sides of the first and second cells; and wherein the first and second cells having a bus pad disposed on the first and second sides; wherein the structural conductor is soldered to the bus pad on the second side of the first cell and the first side of the second cell.

20. The solar window assembly of claim 16, wherein the structural conductor is formed having a continuous circular, oblong, rectangular, triangular or polygon shape.

21. The solar window assembly of claim 16, wherein the structural conductor is formed having a "C" shape or a "U" shape.

22. The solar window assembly of claim 16, further comprising adhesive disposed on a junction point of the first solar cell and the structural conductor; the adhesive to adhere to a surface of the first window pane.

* * * * *